US012751190B2

(12) United States Patent
Hu et al.

(10) Patent No.: US 12,751,190 B2
(45) Date of Patent: Sep. 29, 2026

(54) DISPLAY PANEL WITH MULTIPLE FILTER STRUCTURES AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Ming Hu, Beijing (CN); Bo Shi, Beijing (CN); Taofeng Xie, Beijing (CN); Jianji Fu, Beijing (CN)

(73) Assignees: CHENGDU BOE OPTOELECTRONICS TECHNOLOGY CO. , LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 357 days.

(21) Appl. No.: 18/281,960

(22) PCT Filed: May 23, 2022

(86) PCT No.: PCT/CN2022/094512
§ 371 (c)(1),
(2) Date: Sep. 14, 2023

(87) PCT Pub. No.: WO2023/225805
PCT Pub. Date: Nov. 30, 2023

(65) Prior Publication Data

US 2025/0031555 A1 Jan. 23, 2025

(51) Int. Cl.
*H10K 59/80* (2023.01)
*G06F 3/041* (2006.01)
(Continued)

(52) U.S. Cl.
CPC ....... *H10K 59/8792* (2023.02); *G06F 3/0412* (2013.01); *H10K 59/40* (2023.02);
(Continued)

(58) Field of Classification Search
CPC ... H10K 59/8792; H10K 59/40; G06F 3/0412
See application file for complete search history.

(56) References Cited

U.S. PATENT DOCUMENTS 7,072,096 B2 7/2006 Holman et al.
7,400,439 B2 7/2008 Holman
(Continued)

FOREIGN PATENT DOCUMENTS

CN 104020600 A 9/2014
CN 111653683 A 9/2020
CN 112186007 A 1/2021
CN 112840744 A 5/2021
(Continued)

OTHER PUBLICATIONS

Sun et al. CN 114203929 A,, Machine Translation 2022 (Year: 2022).*
(Continued)

*Primary Examiner* — Tracie Y Green
(74) *Attorney, Agent, or Firm* — XSENSUS LLP

(57) ABSTRACT

A display panel includes a display substrate, a filter structure and a cover plate. At least a part of the filter structure includes a filter layer, a lens layer and a filling layer, and the lens layer is located on a side of the filter layer away from the display substrate, and is provided with a first light transmission hole, and the side wall of the first light transmission hole is expanded along the direction away from the display substrate; the filling layer is filled in the first light transmission hole, and the refractive index of the filling layer is greater than that of the lens layer where the first light transmission hole filled by the filling layer is located.

19 Claims, 6 Drawing Sheets

(51) Int. Cl.
*G06F 3/044* (2006.01)
*H10K 59/40* (2023.01)

(52) U.S. Cl.
CPC .......... *G06F 3/0443* (2019.05); *G06F 3/0446* (2019.05); *G06F 2203/04111* (2013.01); *G06F 2203/04112* (2013.01)

(56) References Cited

U.S. PATENT DOCUMENTS

| | | | |
|---|---|---|---|
| 2004/0080938 A1 | 4/2004 | Holman et al. | |
| 2006/0152931 A1 | 7/2006 | Holman | |
| 2015/0346550 A1 | 12/2015 | Wang | |
| 2021/0089165 A1* | 3/2021 | Ren | G06F 3/0412 |
| 2021/0181880 A1* | 6/2021 | Tang | G03F 7/0007 |
| 2021/0327865 A1* | 10/2021 | Yamazaki | H01L 25/167 |
| 2021/0399264 A1 | 12/2021 | Ueda et al. | |
| 2022/0052298 A1 | 2/2022 | Ge | |
| 2022/0085335 A1* | 3/2022 | Shimatsu | H10K 59/38 |
| 2022/0158133 A1 | 5/2022 | Li et al. | |

FOREIGN PATENT DOCUMENTS

| | | | |
|---|---|---|---|
| CN | 113383610 | A | 9/2021 |
| CN | 114203929 | A | 3/2022 |
| CN | 114518661 | A | 5/2022 |
| EP | 2397875 | A2 | 12/2011 |
| EP | 2402797 | A2 | 1/2012 |
| EP | 2410357 | A2 | 1/2012 |
| EP | 2420872 | A2 | 2/2012 |
| EP | 2420873 | A2 | 2/2012 |
| EP | 2423717 | A2 | 2/2012 |
| KR | 2019-0097914 | A | 8/2019 |
| WO | 03/056876 | A2 | 7/2003 |
| WO | 2021/254228 | A1 | 12/2021 |

OTHER PUBLICATIONS

International Search Report and Written Opinion mailed on Jun. 30, 2022, in corresponding PCT/CN2022/094512, 9 pages.

First Office Action mailed on Jul. 20, 2026, received for CN Application 202280001366.3, 17 pages including English Translation.

* cited by examiner

DISPLAY PANEL WITH MULTIPLE FILTER STRUCTURES AND DISPLAY DEVICE

CROSS REFERENCE

The present application is based upon International Application No. PCT/CN2022/094512, filed on May 23, 2022, and the entire contents thereof are incorporated herein by reference.

TECHNICAL FIELD

The present disclosure relates to the field of display technology, and in particular, to a display panel and a display device.

BACKGROUND

The display panel is an integral part of electronic devices such as mobile phones and computers, and includes liquid crystal display panel, organic electroluminescent display panel, and the like.

It should be noted that, information disclosed in the above background portion is provided only for better understanding of the background of the present disclosure, and thus it may contain information that does not form the prior art known by those ordinary skilled in the art.

SUMMARY

The disclosure provides a display panel and a display device.

According to an aspect of the present disclosure, there is provided a display panel, including:

a display substrate including a plurality of light-emitting devices distributed in an array;

a plurality of filter structures, disposed on a light-emitting side of the display substrate, one of the light-emitting devices corresponds to one of the filter structures; at least a part of the filter structures includes a filter layer, a lens layer and a filling layer, the lens layer is disposed on the side of the filter layer away from the display substrate, the lens layer is provided with a first light transmission hole exposing at least part of the filter layer, a side wall of the first light transmission hole is expended along a direction away from the display substrate; the filling layer is filled in the first light transmission hole and laminated on a surface of the filter layer away from the display substrate, a refractive index of the filling layer is greater than the refractive index of the lens layer where the light transmission hole filled by the filling layer is located; and a cover plate, disposed on a side of the filter structures away from the display substrate.

In an exemplary implementation of the present disclosure, materials of the lens layer and the filter layer of a same filter structure are different.

In an exemplary implementation of the present disclosure, respective lens layers are connected into an integral structure.

In an exemplary implementation of the present disclosure, the lens layer and the filter layer of a same filter structure are integrally structured.

In an exemplary implementation of the present disclosure, the filter layer of respective filter structures includes at least two filter layers of different colors; and the filter layers of different colors have different refractive indices; and in two filter structures in which two filter layers with different refractive indexes are located, a thickness of the lens layer of the filter structure to which the filter layer with a larger refractive index belongs is greater than the thickness of the lens layer of the filter structure to which the filter layer with a smaller refractive index belongs.

In an exemplary implementation of the present disclosure, the filter layer includes a first filter layer, a second filter layer and a third filter layer with different colors, the refractive index of the first filter layer is greater than the refractive index of the second filter layer, and the refractive index of the second filter layer is greater than the refractive index of the third filter layer;

the thickness of the lens layer of the filter structure to which the first filter layer belongs is 2.5 μm-3 μm;

the thickness of the lens layer of the filter structure to which the second filter layer belongs is 2 μm-2.5 μm; and the thickness of the lens layer of the filter structure to which the third filter layer belongs is 1.5 μm-2 μm.

In an exemplary implementation of the present disclosure, the filter layer of respective filter structures includes at least two filter layers of different colors; the filter layers of different colors have different refractive indices;

in two filter structures in which two filter layers with different refractive indexes are located, a slope angle of the sidewall of the first light transmission hole of the filter structure to which the filter layer with a larger refractive index belongs is smaller than the slope angle of the sidewall of the first light transmission hole of the filter structure to which the filter layer with a smaller refractive index belongs.

In an exemplary implementation of the present disclosure, the filter layer includes a first filter layer, a second filter layer and a third filter layer with different colors, the refractive index of the first filter layer is greater than the refractive index of the second filter layer, and the refractive index of the second filter layer is greater than the refractive index of the third filter layer;

the slope angle of the sidewall of the first light transmission hole of the filter structure to which the first filter layer belongs is 45°-50°;

the slope angle of the sidewall of the first light transmission hole of the filter structure to which the second filter layer belongs is 50°-55°; and the slope angle of the sidewall of the first light transmission hole of the filter structure to which the third filter layer belongs is 55°-60°.

In an exemplary implementation of the present disclosure, the filter layer of respective filter structures includes at least two filter layers of different colors; and the filter layers of different colors have different refractive indices; and in two filter structures in which two filter layers with different refractive indexes are located, the refractive index of the filling layer of the filter structure to which the filter layer with a larger refractive index belongs is greater than the refractive index of the filling layer of the filter structure to which the filter layer with a smaller refractive index belongs.

In an exemplary implementation of the present disclosure, the filter layer includes a first filter layer, a second filter layer and a third filter layer with different colors, the refractive index of the first filter layer is greater than the refractive index of the second filter layer, and the refractive index of the second filter layer is greater than the refractive index of the third filter layer;

the refractive index of the filling layer of the filter structure to which the first filter layer belongs is 1.83-1.87;

the refractive index of the filling layer of the filter structure to which the second filter layer belongs is 1.73-1.77; and the refractive index of the filling layer of the filter structure to which the third filter layer belongs is 1.68-1.72.

In an exemplary implementation of the present disclosure, the display panel further includes:

a planarizing layer, covering respective filter structures, and the refractive index of the planarizing layer is not less than the refractive index of the filling layer.

In an exemplary implementation of the present disclosure, the planarizing layer is integrally structured with at least one filling layer.

In an exemplary implementation of the present disclosure, the display panel further includes:

a light-absorbing layer, disposed on a same surface as the filter layer, and having a plurality of through holes, one of the through holes corresponds to one of the light-emitting devices; and at least a part of one filter layer is located in one of the through holes.

In an exemplary implementation of the present disclosure, the display panel further includes:

a light concentrating layer, disposed between the display substrate and the filter structure, and is configured to converge at least part of light emitted by the light-emitting device to the first light transmission hole of the corresponding filter structure.

In an exemplary implementation of the present disclosure, the light concentrating layer includes:

a first refraction layer, disposed on the light-emitting side of the display substrate and including a plurality of second light transmission holes, one of the second light transmission holes corresponds to one of the light-emitting devices and one of the first light transmission holes, a sidewall of the second light transmission hole is expanded in a direction away from the display substrate; and a second refraction layer, configured to cover the first refraction layer and fill the second light transmission hole; the refractive index of the second refraction layer is greater than the refractive index of the first refraction layer.

In an exemplary implementation of the present disclosure, the display panel further includes a driving backplane and a pixel definition layer, the pixel definition layer and the light-emitting device are disposed on a same side of the driving backplane, and the pixel definition layer is provided with an opening defining a range of each of the light-emitting devices;

in one opening and the first light transmission hole and second light transmission hole corresponding to the opening, an orthographic projection of the opening on the driving backplane is located within the orthographic projection of the second light transmission hole on the driving backplane, and the orthographic projection of the second light transmission hole on the driving backplane is located within the orthographic projection of the first light transmission hole on the driving backplane.

In an exemplary implementation of the present disclosure, the display panel further includes:

a touch electrode layer, disposed on the light-emitting side of the display substrate, wherein the first refractive layer covers the touch electrode layer; the touch electrode layer is a mesh structure having a plurality of mesh holes connected by a plurality of channel lines; at least one of the light-emitting devices corresponds to one of the mesh holes; and a width of the channel line is smaller than a distance between two adjacent second light transmission holes.

According to an aspect of the present disclosure, there is provided a display device including the display panel according to any aspect above.

It is to be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of this specification, illustrate embodiments consistent with the disclosure and together with the description serve to explain the principles of the disclosure. Apparently, the drawings in the following description are only some embodiments of the present disclosure, and those skilled in the art can obtain other drawings according to these drawings without creative efforts.

DETAILED DESCRIPTION

Figure 1:
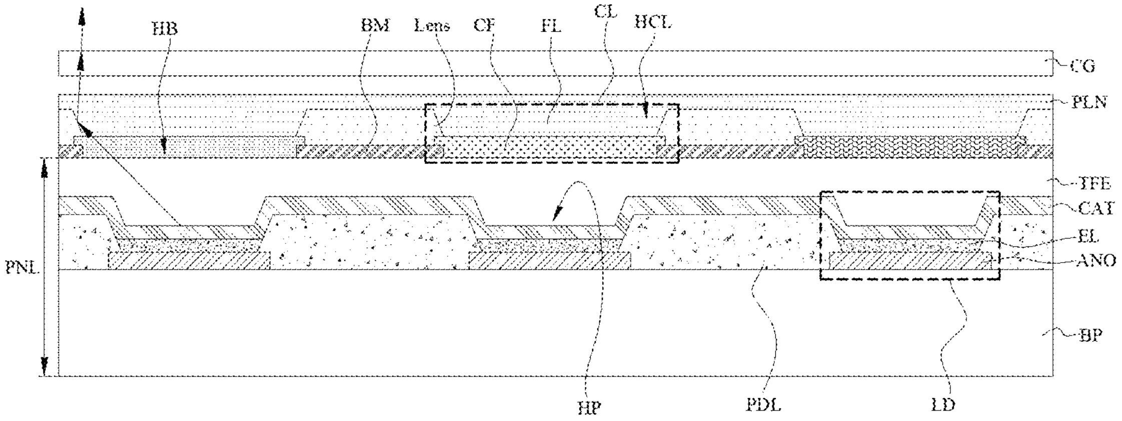
FIG. 1 is a schematic cross-sectional view of an embodiment of the first type of embodiment of the display panel of the present disclosure.

Example embodiments will now be described more fully with reference to the accompanying drawings. Example embodiments may, however, be embodied in many forms and should not be construed as limited to the embodiments set forth herein; rather, these embodiments are provided so that this disclosure will be thorough and complete, and will fully convey the concept of example embodiments to those skilled in the art. The same reference numerals in the drawings denote the same or similar structures, and thus their detailed descriptions will be omitted. Furthermore, the drawings are merely schematic illustrations of the present disclosure and are not necessarily drawn to scale.

The terms "a", "an", "the", "said" and "at least one" are used to indicate the presence of one or more elements/components/etc.; the terms "comprise" and "have" are used to indicate an open enclosure and means that there may be additional elements/components/etc. in addition to the listed elements/components/etc.; the terms "first", "second" and "third" etc. are only used as a marker, not a limit on the number of its objects.

The row direction X and the column direction Y herein are only two directions perpendicular to each other. In the drawings of the present disclosure, the row direction X can be horizontal, and the column direction Y can be vertical, but it is not limited thereto. If the display panel is rotated, the actual orientation of the row direction X and the column direction Y may change.

Figure 2:
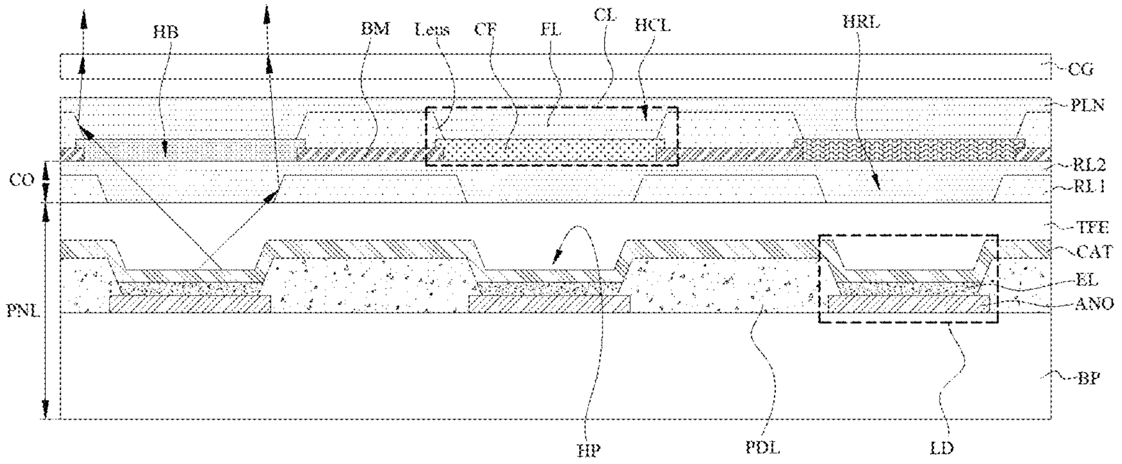
FIG. 2 is a schematic cross-sectional view of another embodiment of the first type of embodiment of the display panel of the present disclosure.
Figure 3:
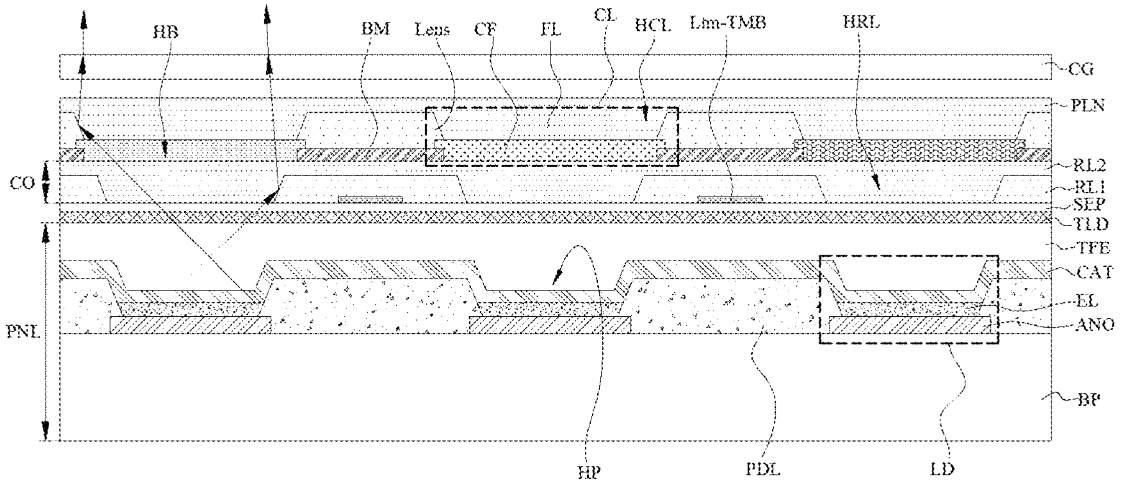
FIG. 3 is a schematic cross-sectional view of still another embodiment of the first type of embodiment of the display panel of the present disclosure.

In related technology, an organic electroluminescent display panel may include a driving backplane and multiple light-emitting devices located on one side of the driving backplane. Each light-emitting device may be an organic light-emitting diode (OLED). The light-emitting devices may be controlled to emit light independently through the driving backplane to implement image display. At the same time, the display panel also includes a cover plate made of transparent material such as glass, which can cover the side of the light-emitting device away from the driving backplane for protection. The light emitted by the light-emitting device is emitted from the cover to the air outside the display panel. Since the refractive index of the cover is greater than that of the air, when light enters the air from the cover, the light whose incident angle reaches the critical angle of total reflection will be totally reflected at the interface between the cover and the air, causing part of the light to be unable to emit from the cover, reducing the light extraction efficiency of the display panel, which affects the brightness. In this process, the larger the incident angle of the light irradiated to the cover plate, the easier it is for total reflection to occur. To increase the brightness of the display panel, it is necessary to increase the power consumption of the light-emitting device, which increases the energy consumption An embodiment of the present disclosure provides a display panel, as shown in FIGS. 1-3, the display panel includes a display substrate PNL, a filter structure CL, and a cover plate CG.

The display substrate PNL has a plurality of light-emitting devices LD distributed in an array.

There are multiple filter structures CL, which are disposed on the light-emitting side of the display substrate PNL, and one light-emitting device LD corresponds to one filter structure CL. At least a part of the filter structure CL includes a filter layer CF, a lens layer Lens, and a filling layer FL. The lens layer Lens is located on the side of the filter layer CF away from the display substrate PNL, and is provided with a light transmission hole HCL that exposes at least a part of the filter layer CF, the sidewall of the first light transmission hole HCL expands in a direction away from the display substrate PNL; the filling layer FL is filled in the first light transmission hole HCL, and laminated on the surface of the filter layer CF away from the display substrate PNL, the refractive index of the filling layer FL is greater than the refractive index of the lens layer Lens where the first light transmission hole HCL filled by the filling layer FL is located. The filter layers CF of the respective filter structures CL include at least two types of filter layer CF of different colors. The cover plate CG can be disposed on a side of each filter structure CL away from the display substrate PNL.

In the display panel of the embodiment of the present disclosure, if different light-emitting devices LD can emit different monochromatic lights, color display can be directly realized. In this case, the color of the filter layer CF of the filter structure CL can be the same to the color of light emitted by the corresponding light-emitting device LD, so that part of the ambient light can be filtered through the filter layer CF, and the reflection of ambient light inside the display substrate PNL can be reduced. The thick anti-reflective films such as circular polarizers can be omitted, which is beneficial to reducing the thickness of the display panel.

If the light-emitting devices LD emit the same color, color display can be achieved through filter layers CF of different colors. Of course, at this time, the filter layer CF can still play a role in reducing reflection of ambient light.

Since the refractive index of the filling layer FL is greater than the refractive index of the lens layer Lens where the first light transmission hole HCL filled thereby is located, and the sidewall of the first light transmission hole HCL expands in a direction away from the display substrate PNL, at least part of the emitted light of the light-emitting device LD is totally reflected at the side wall of the first light transmission hole HCL, so that the light emitted by the corresponding light-emitting device LD can be converged by using the filter structure CL, so that the incident angle of the light emitted from the cover plate CG is smaller, which reduces the total reflection of light at the interface between the cover CG and the air, improves light extraction efficiency, and improves brightness without increasing power consumption.

Hereinafter, the display panel of the present disclosure is described in detail.

As shown in FIG. 1 to FIG. 3, the display substrate PNL can be an organic electroluminescent display substrate, or it can be a liquid crystal display substrate or other display substrate that can emit light. Taking the organic electroluminescent display substrate as an example, the display substrate PNL can include a driving backplane BP, a light-emitting device LD and an encapsulation layer TFE.

The driving backplane BP includes a driving circuit by which the light-emitting device LD can be driven to emit light to display images.

The driving backplane BP may include a substrate and a circuit layer disposed on one side of the substrate. The substrate may have a flat plate structure, and its material may be a hard material such as glass or a soft material such as polyimide. Meanwhile, the substrate can be a single-layer or multi-layer structure.

The circuit layer may include a driving circuit, by which the light-emitting device LD can be driven to emit light. For example, the display panel can be at least divided into a display area and a peripheral area located outside the display area. Correspondingly, the area of the circuit layer located in the display area is the pixel area, and the area located in the peripheral area is the edge area, that is, the edge area is outside the pixel area. The drive circuit may include a pixel circuit located in the pixel area and a peripheral circuit located in the edge area, wherein the pixel circuit may be a 7T1C, 6T1C or other pixel circuit, as long as it can drive the light-emitting device LD to emit light, no special structure limitation is made here. The number of pixel circuits can be the same as the number of light-emitting devices LD, and they are connected to each light-emitting device LD in a one-to-one correspondence, so as to respectively control each light-emitting device LD to emit light. In the embodiment, nTmC indicates that one pixel circuit includes n transistors (indicated by the letter "T") and m capacitors (indicated by the letter "C"). Certainly, the same pixel circuit can also be connected with multiple light-emitting devices LD, and simultaneously drive the multiple light-emitting devices LD to emit light, which is not specifically limited here.

The peripheral circuit is connected with the pixel circuit, and is used for inputting a driving signal to the pixel circuit so as to control the light-emitting device LD to emit light. The peripheral circuit may include a gate drive circuit and a light emission control circuit, and of course, may also include other circuits, and the specific structure of the peripheral circuit is not specifically limited here.

The above-mentioned circuit layer may include a plurality of thin film transistors and capacitors, wherein the thin film transistors may be top-gate or bottom-gate type thin film transistors, and each thin film transistor may include an active layer and a gate electrode. The active layer of each thin film transistor is disposed in the same semiconductor layer, and the gate electrode is disposed in the same gate layer, so as to simplify the process.

Taking the top-gate thin film transistor as an example, the circuit layer may include a semiconductor layer, a first gate insulating layer, a first gate layer, a second gate insulating layer, a second gate layer, an interlayer dielectric layer, a first source-drain layer, a passivation layer, a first planar layer, a second source-drain layer and a second planar layer disposed successively in the direction away from the substrate, the specific pattern of each film layer depends on the specific composition of the driving circuit, which is not specially limited here.

As shown in FIG. 1, one side of the driving backplane BP is provided with a plurality of light-emitting devices LD and a pixel definition layer PDL used to define the range of the light-emitting devices LD. For example, the pixel definition layer PDL and the light-emitting device LD can be disposed on a surface of the second planar layer away from the substrate. Each light-emitting device LD is located in the display area of the display panel. Each light-emitting device LD may include a first electrode ANO, a second electrode CAT, and a light-emitting layer EL disposed between the first electrode ANO and the second electrode CAT. Electric signals are applied to the first electrode ANO and the second electrode CAT to excite the light emitting layer EL to emit light. The light-emitting device LD may be an organic light emitting diode (OLED).

As shown in FIG. 1, the first electrodes ANO of each light-emitting device LD are distributed at intervals. The pixel definition layer PDL is provided with openings HP that expose each first electrode ANO, that is, one opening HP exposes one first electrode ANO, and the range corresponding to one opening HP is the range of one light-emitting device LD, and the boundary of the orthographic projection of the light-emitting device LD on the driving backplane BP is the boundary of the orthographic projection of the opening HP on the driving backplane BP. If the side walls of the opening HP are slopes that expand in the direction away from the driving backplane BP, then the orthographic projection of the light-emitting device LD on the driving backplane BP is the outer boundary of the orthographic projection of the opening HP on the driving backplane BP. The shape of the opening HP, that is, the shape of the boundary of its orthographic projection on the driving backplane BP, can be a polygon such as a rectangle, a pentagon, a hexagon, etc., or it can be an ellipse, a sector, or other shapes, the shape is not specially limited here.

The light emitting layer EL is at least partially located in the opening HP and stacked with the first electrode ANO. The light emitting layer EL may include a hole injection layer, a hole transport layer, a light emitting material layer, an electron transport layer, and an electron injection layer sequentially stacked in a direction away from the driving backplane BP. Of course, other structures can also be used, as long as they can cooperate with the first electrode ANO and the second electrode CAT to emit light.

The second electrode CAT can cover the light-emitting layer EL, and the second electrode CAT can be a continuous whole-layer structure, so that the respective light-emitting devices LD can share the same second electrode CAT. At the same time, the second electrode CAT can be the cathode of the light-emitting device LD, which can adopt a light-transmitting structure, so that the light-emitting device LD can emit light in a direction away from the driving backplane BP. For example, the material of the second electrode CAT can be metal magnesium, silver or their alloys, etc., under a certain thickness, it can transmit light while conducting electricity. At the same time, the first electrode ANO can be in an opaque structure, so that the light-emitting device LD has a top emission structure.

In some embodiments of the present disclosure, as shown in FIG. 1, each light-emitting device LD can emit light independently, and the light-emitting colors of different light-emitting devices LD can be different. Specifically, the light-emitting layer EL can include multiple light-emitting units arranged at intervals in one-to-one correspondence in each opening HP, each light-emitting unit can emit light independently, and the light-emitting colors can be different, so that color display can be directly realized. Alternatively, each light-emitting device LD can also share at least one of the hole injection layer, hole transport layer, electron transport layer and electron injection layer, but does not share the light-emitting material layer, that is, the light-emitting material layer includes a plurality of material units distributed in arrays, which can also achieve different light emitting colors of different light-emitting devices LD.

In other embodiments of the present disclosure, the light-emitting layer EL can also cover the pixel definition layer PDL and each first electrode ANO at the same time, that is, each light-emitting device LD can share the same light-emitting layer EL, and at this time, the light-emitting colors of each light-emitting device LD are the same.

As shown in FIG. 1, the encapsulation layer TFE can cover each light-emitting device LD, and is used to block external water and oxygen, and prevent them from corroding the light-emitting device LD. For example, the encapsulation layer TFE can adopt the method of thin film encapsulation, which can include a first inorganic layer, an organic layer and a second inorganic layer.

The first inorganic layer may cover each light-emitting device LD, that is, the first inorganic layer may cover the surface of the second electrode CAT away from the driving backplane BP. The material of the first inorganic layer may include inorganic insulating materials such as silicon nitride and silicon oxide.

The organic layer may be disposed at a surface of the first inorganic layer away from the driving backplane BP, and the boundary of the organic layer may be limited inside the boundary of the first inorganic layer by the barrier dam located in the peripheral area. At the same time, the boundary of the orthographic projection of the organic layer on the driving backplane BP can be located in the peripheral area, ensuring that the organic layer can cover each light-emitting device LD.

The second inorganic layer can cover the organic layer and the first inorganic layer not covered by the organic layer, the second inorganic layer can block the intrusion of water and oxygen, and is planarized by the original layer that has fluidity before curing. The material of the second inorganic layer may include inorganic insulating materials such as silicon nitride and silicon oxide.

As shown in FIG. 1, the filter structure CL can be disposed on the light-emitting side of the display substrate PNL, that is, the side of the encapsulation layer TFE away from the driving backplane BP. The number of filter structures CL is multiple, and one light-emitting device LD corresponds to one filter structure CL, that is, the orthographic projection of one filter structure CL on the driving backplane BP is at least partly overlapped with the orthographic projection of one light-emitting device LD on the driving backplane BP, so that at least part of the light emitted by the light-emitting device LD can pass through the corresponding filter structure CL.

The filter structure CL can transmit monochromatic light, and the colors of the light transmitted by different filter structures CL can be different. If the light emitting colors of the light-emitting devices LD are the same, the color display can be realized by the filter structures CL, and the reflection of ambient light can also be reduced. If different light-emitting devices LD have different light emission colors, the filter structure CL can reduce the reflection of ambient light.

At least a part of the filter structure CL can also converge at least part of the light emitted by its corresponding light-emitting device LD. That is to say, there may be a part of the filter structures CL that can only filter light, and at least a part of the filter structures CL can play the role of light filtering and light concentrating at the same time. Of course, in order to improve the uniformity of the brightness of the display panel, each filter structure CL can play the role of light filtering and light concentrating at the same time.

The following is a detailed description of the filter structure CL with the functions of light filtering and light concentrating.

As shown in FIG. 1, at least a part of the filter structures CL may include a filter layer CF, a lens layer Lens and a filling layer FL.

The filter layer CF is disposed at the light-emitting side of the display substrate PNL, that is, the side of the encapsulation layer TFE away from the driving backplane BP. Each filter layer CF is arranged in an array, and two adjacent filter layers CF can be arranged at intervals or can be in contact with each other. A filter layer CF has a unique color so that it can only transmit blue light, red light, green light or other monochromatic light.

The respective filter layers CF include at least two types of filter layer CF of different colors, for example, the filter layer CF may include a red filter layer, a green filter layer and a blue filter layer, thereby achieving the above-mentioned color display and the effect of reducing the reflection of ambient light. For example, the respective light-emitting devices LD include three types of light-emitting devices LD with different light-emitting colors, that is, a red light-emitting device that emits red light, a green light-emitting device that emits green light, and a blue light-emitting device that emits blue light. Correspondingly, the filter layer CF corresponding to the red light-emitting device is a red filter layer, which can transmit red light; the filter layer corresponding to the green light-emitting device is a green filter layer CF, which can transmit green light; and the filter layer CF corresponding to the blue light-emitting device is a blue filter layer that can transmit blue light.

The materials of the filter layers CF of different colors are different, so the refractive index is also different. For example, the refractive index of the red filter layer can be greater than that of the green filter layer, and the refractive index of the green filter layer can be greater than that of the blue filter layer.

Figure 12:
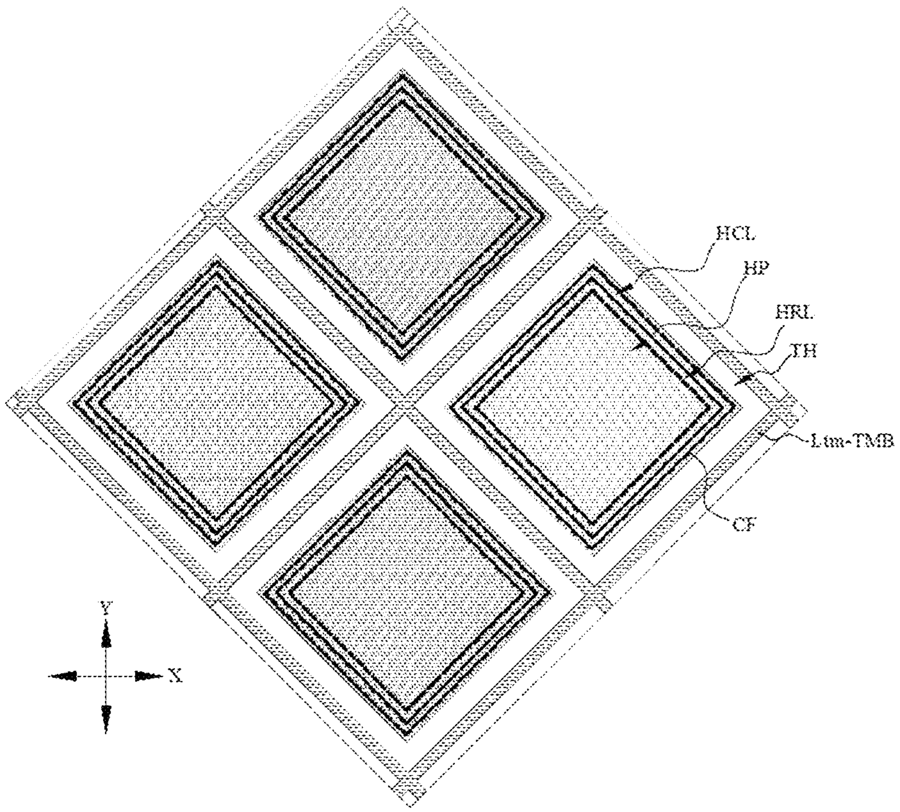
FIG. 12 is a partial top view of an embodiment of the display panel of the present disclosure.

As shown in FIG. 1 and FIG. 12, the lens layer Lens can be disposed at the side of the filter layer CF away from the display substrate PNL, the lens layer Lens is made of a transparent material, and can transmit light of multiple colors, and the lens layer Lens is provided with a first light transmission hole HCL, and the first light transmission hole HCL exposes at least a partial area of the filter layer CF.

One first light transmission hole HCL corresponds to one light-emitting device LD, that is, the orthographic projection of a light-emitting device LD on the driving backplane BP and the orthographic projection of a first light transmission hole HCL on the driving backplane BP at least partially overlap, so that at least part of the light emitted by the light-emitting device LD can be irradiated into the corresponding first light transmission hole HCL. Further, the range of the first light transmission hole HCL may not be smaller than the range of its corresponding light-emitting device LD, that is, the orthographic projection of one opening HP on the driving backplane BP is located within the orthographic projection of one first light transmission hole HCL on the driving backplane BP.

The side wall of the first light transmission hole HCL can expand in a direction away from the display substrate PNL, and its side wall can be enclosed by multiple planes, or can be a circular truncated cone surface, or be enclosed by multiple curved surfaces, as long as the size of the first light transmission hole HCL increases along the direction away from the display substrate PNL, so that the shape of the cross section of the first light transmission hole HCL along the direction perpendicular to the substrate is an inverted trapezoid.

If the side wall of the first light transmission hole HCL is enclosed by multiple planes, the slope angle of the side wall of the first light transmission hole HCL is the angle between the side wall and the filter layer CF; if sidewall of the first light transmission hole HCL is a curved surface, its slope angle of the sidewall is the angle between the profile of the sidewall of the first light transmission hole HCL in a cross section perpendicular to the display substrate and the filter layer CF. Further, the shape of the first light transmission hole HCL can be the same as that of the corresponding light-emitting device LD, that is, the shape of the first light transmission hole HCL (the shape of the profile of the orthographic projection on the driving backplane BP) can be the same as that of the corresponding opening HP, for example, the shape of the opening HP is a polygon, then the shape of the first light transmission hole HCL is also a polygon, and the number of sides of the polygon is the same, the sides of the orthographic projection of the first light transmission hole HCL and the sides of the projection of the opening HP are overlapped or parallel in one-to-one correspondence.

Figure 7:
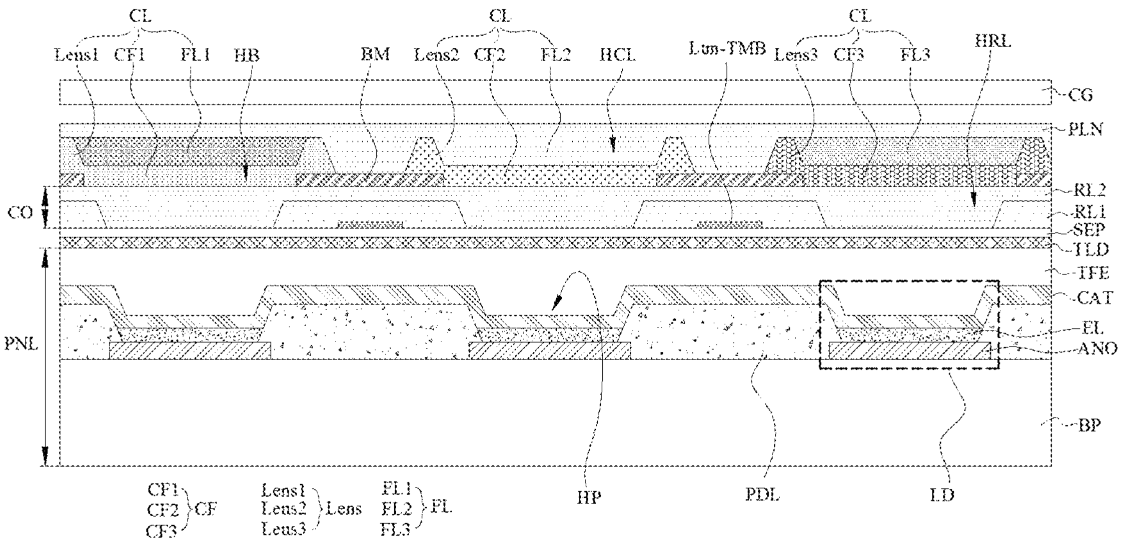
FIG. 7 is a schematic cross-sectional view of a fourth embodiment of the second type of embodiment of the display panel of the present disclosure.

As shown in FIG. 1 and FIG. 7, the filling layer FL can be made of a transparent material, which can transmit light of multiple colors, and is filled in the first light transmission hole HCL, and is directly laminated on the surface of the filter layer CF away from the display substrate PNL. The refractive index of the filling layer FL is greater than the refractive index of the lens layer Lens where the first light transmission hole HCL filled thereby is located, and part of the light emitted by the light-emitting device LD can be total reflected at the interface of the corresponding filling layer FL and the side wall of the first light transmission hole HCL, so as to achieve the effect of concentrating light. In addition, the thickness of the filling layer FL is not greater than the depth of the first light transmission hole HCL it fills.

As shown in FIG. 1 and FIG. 7, in order to achieve planarization, each filter structure CL can be covered by a planarizing layer PLN, and the refractive index of the planarizing layer PLN is not less than the refractive index of the filling layer FL, for example, the planarizing layer PLN may be the same material as at least one filling layer FL, and be integrally structured so as to be formed at the same time. Of course, the planarizing layer PLN can also be formed separately using a material different from that of each filling layer FL. In addition, the planarization can be realized by making the thickness of the filling layer FL the same as the depth of the first light transmission hole HCL without providing the planarizing layer PLN.

In addition, as shown in FIG. 1, a light-absorbing layer BM can also be provided in the display panel, which can be made of black resin or other materials, as long as it can absorb light. The light-absorbing layer BM can be disposed on the same surface as the filter layer CF, and is provided with a plurality of through-holes HB for light transmission, one through-hole HB corresponds to one light-emitting device LD, that is, the orthographic projection of one through-hole HB on the driving backplane BP is at least partially overlapped with the orthographic projection of one opening HP on the driving backplane BP. Further, in order to prevent the light-absorbing layer BM from blocking the light-emitting device LD, the orthographic projection of one opening HP on the driving backplane BP may be located within the orthographic projection of the corresponding through hole HB on the driving backplane BP.

As shown in FIG. 1, at least part of one filter layer CF is located in one through hole HB, for example, each filter layer CF is arranged in each through hole HB in a one-to-one correspondence, and the edge of the filter layer CF can extend to a surface of the light-absorbing layer BM away from the display substrate PNL, of course, it can also only fill the through hole HB. During manufacture, the light absorbing layer BM having the through hole HB can be formed first, and then the light filter layers CF of different colors can be formed respectively. The light range can be limited by the light absorbing layer BM, and it can also reduce the reflection of ambient light.

Of course, the light absorbing layer BM can also be formed by stacking two adjacent filter layers CF with different colors, so as to absorb light.

The filter structure CL that only functions as the filter may include a filter layer CF, without the first light transmission hole HCL, and without the lens layer Lens and the filling layer FL. However, if the filter structure CL that only functions as the filter and the filter structure CL that can filter and concentrate light are both existed in one implementation, both of them may include a planarizing layer PLN to achieve planarization.

Hereinafter, different forms of the filter structure CL are exemplified.

As shown in FIGS. 1 to 3, in the first type of implementation of the present disclosure, the materials of the lens layer Lens and the filter layer CF of the same filter structure CL are different, so the two can be formed independently. The lens layers Lens of each filter structure CL can be connected as an integral structure, and both can be formed simultaneously through a half-tone masking process or a grayscale masking process.

In some implementations, for one filter structure CL, the filter layer CF can extend to the surface of the light absorbing layer BM away from the display substrate PNL, while adjacent filter layers CF are not in contact, thereby exposing part of the light absorbing layer BM. The lens layer Lens of the filter structure CL can be disposed on the surface of the filter layer CF away from the display substrate PNL, that is, the sidewall of the first light transmission hole HCL is located inside the boundary of the filter layer CF. Meanwhile, the orthographic projection of the through hole HB on the driving backplane BP may be located within the orthographic projection of the corresponding first light transmission hole HCL on the driving backplane BP. In addition, the lens layer Lens can extend to the light-absorbing layer BM not covered by the filter layer CF, so that each lens layer Lens is connected integrally. When forming the lens layer Lens, it is only necessary to form the material of the lens layer Lens, and form the first light transmission hole HCL by a mask process.

The material of the lens layer Lens can be a transparent material such as optically clear adhesive (OCA), and the refractive index can be 1.5, of course, it can also be larger or smaller. The filling layer FL in the first light transmission hole HCL and the planarizing layer PLN can be integrally structured, so that they can be formed simultaneously. The material of the filling layer FL can be transparent materials such as optically clear adhesive (OCA), and the refractive index can be 1.7-1.75, as long as it is greater than the refractive index of the lens layer Lens.

In other embodiments of the first type of embodiment, the lens layer Lens may also be located only on the surface of the filter layer CF away from the display substrate PNL, without contacting the light absorbing layer BM. In addition, the sidewall of the first light transmission hole HCL may be aligned with the boundary of the filter layer CF or located outside the filter layer CF, as long as the sidewall of the first light transmission hole HCL can total reflect at least part of the light emitted by the light-emitting device LD.

As shown in FIGS. 4 to 7, in the second type of embodiment of the present disclosure, the lens layer Lens and the filter layer CF of the same filter structure CL are integrated structures, so that the lens layer Lens and the filter layer CF can be integrally formed, thus simplifying the process. Correspondingly, the refractive index of the filter layer CF and the refractive index of the lens layer Lens in the same filter structure CL are the same, and the lens layer Lens can only transmit monochromatic light. At this time, the lens layer Lens is equivalent to a protrusion formed on the filter layer CF.

Hereinafter, the second type of implementation is exemplified with the first to fifth implementations.

Figure 4:
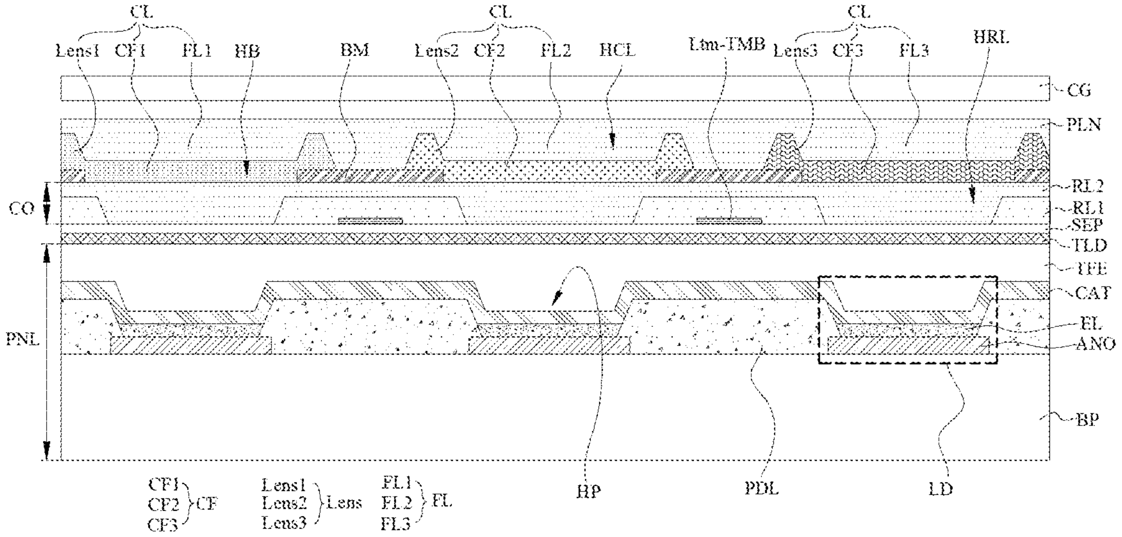
FIG. 4 is a schematic cross-sectional view of the first embodiment of the second type of embodiment of the display panel of the present disclosure.

As shown in FIG. 4, in the first embodiment, the thickness of the lens layer Lens of respective filter structures CL is the same, that is, the thickness of the above-mentioned protrusions is the same, and the depth of the first light transmission hole HCL is the thickness of the lens layer Lens. Meanwhile, the slope angles of the sidewalls of the respective first light transmission holes HCL are also the same. The material of each filling layer FL is the same as that of the planarizing layer PLN, and respective filling layer FL and the planarizing layer PLN have an integral structure.

The refractive index of the lens layer Lens may be 1.45-1.5, and the refractive indices of the planarizing layer PLN and the filling layer FL may be 1.7-1.75. The thickness of the lens layer Lens may be 1 μm-3 μm, for example 2 μm. The slope angle of the sidewall of the first light transmission hole HCL may be 40°-75°, for example, 55°.

It should be noted that the refractive index of any film layer mentioned in this disclosure refers to the refractive index of light that can pass through the film layer. For example, if the filling layer FL can pass white light, its refractive index refers to the refractive index of white light. However, when the filter layer CF can only transmit monochromatic light, then its refractive index is the refractive index of the monochromatic light it transmits.

The inventors found that when the refractive index of the filling layer FL of each filter structure CL is the same, the larger the refractive index of the lens layer Lens, the greater the total reflection angle (the critical angle at which light is totally reflected on the side wall of the first light transmission hole HCL) is, the less likely total reflection will occur. The lens layers with different refractive indices have different converging effects on light, and the smaller the refractive index of the lens layer Lens is, the greater the converging effect on light is, which is more conducive to improving light output efficiency, and helps to improve the white balance.

For example, the filter layer CF includes a first filter layer CF1, a second filter layer CF2 and a third filter layer CF3 with different colors, and the refractive index of the first filter layer CF1 is greater than the refractive index of the second filter layer CF2, the refractive index of the second filter layer CF2 is greater than the refractive index of the third filter layer CF3; for example, the first filter layer CF1 may be a red filter which has a refractive index of 1.70 relative to red light (taking a wavelength of 620 nm as an example); the second filter layer CF2 may be a green filter layer, and its refractive index relative to green light (taking a wavelength of 550 nm as an example) is 1.63; the third filter layer CF3 may be a blue filter layer with a refractive index of 1.58 relative to blue light (taking the wavelength of 460 nm as an example); correspondingly, the refractive index of each lens layer Lens is the same as the refractive index of the filter layer CF where it is located. If the refractive index of each filling layer FL is 1.85, then the total reflection angles at which the red, green, and blue colors are totally reflected on the side walls of the first light transmission hole HCL of each lens layer Lens are 66.7° (arcsin 1.7/1.85), 61.8° (arcsin 1.63/1.85) and 58.6° (arcsin 1.58/1.85), respectively. It can be seen that the lens layer Lens integrated with the first filter layer CF1 has the largest total reflection angle and the weakest light-converging effect. The light-extraction efficiency is improved the least; different lens layer Lens may improve the light-extraction efficiency differently, which is not conducive to the white balance of the image of the display panel.

Based on the above analysis, the inventor proposes that the difference in converging effect can be compensated for lens layers Lens with different refractive indices, so that the converging effect of each filter structure CL on light is consistent, so that the degree of improvement in light extraction efficiency is consistent, which is conducive to improve white balance and increase brightness uniformity.

Hereinafter, detailed description will be made in the second to the fifth implementations of the second type of implementation.

For the convenience of description, the lens layer Lens of the filter structure CL to which the first filter layer CF1 belongs can be defined as the first lens layer Lens1, and the filling layer FL of the filter structure CL to which the first filter layer CF1 belongs can be defined as the first filling layer FL1; the lens layer Lens of the filter structure CL to which the second filter layer CF2 belongs can be defined as the second lens layer Lens2, and the filling layer FL of the filter structure CL to which the second filter layer CF2 belongs can be defined as the second filling layer FL2; and the lens layer Lens of the filter structure CL to which the third filter layer CF3 belongs can be defined as the third lens layer Lens3, and the filling layer FL of the filter structure CL to which the third filter layer CF3 belongs can be defined as the third filling layer FL3.

Figure 5:
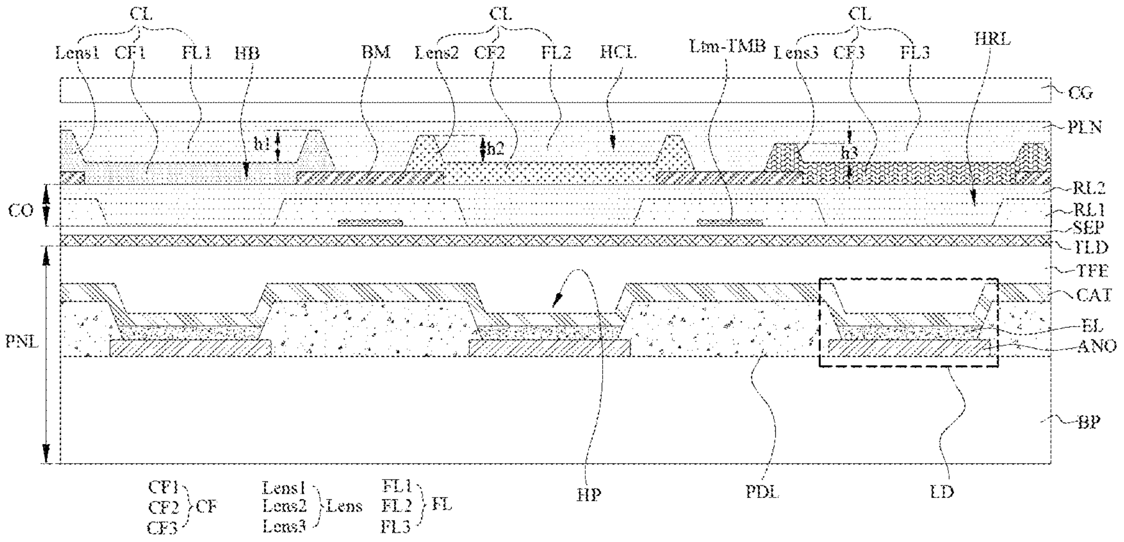
FIG. 5 is a schematic cross-sectional view of a second embodiment of the second type of embodiment of the display panel of the present disclosure.

As shown in FIG. 5, in the second embodiment, the thickness of the lens layer Lens corresponding to the filter layers CF with different refractive indices can be set differently to make up for the difference in light extraction efficiency. Specifically, in the two filter structures CL where the two filter layers CF with different refractive indices are located, the thickness of the layer Lens of filter structure CL to which the filter layer CF with the larger refractive index among the lens layers Lens with different refractive indices belongs is greater than the thickness of the lens layer Lens of the filter structure CL to which the filter layer CF with a smaller refractive index belongs. By thickening the lens layer Lens with large refractive index, the range of the total reflection interface can be increased, and the light concentrating effect can be improved, thereby increasing the light that is totally reflected in the lens layer Lens with large refractive index, so that its improvement of light extraction efficiency has the similar or the same effect of the lens layer Lens with a smaller refractive index, thereby improving the uniformity of brightness of the display panel.

For example, the thickness of the first lens layer Lens1 may be 2.5 μm-3 μm, that is to say, the height of the protrusions of the lens layer Lens integrated with the first filter layer CF1 is 2.5 μm-3 μm.

The thickness of the second lens layer Lens2 is 2 μm-2.5 μm, that is to say, the height of the protrusion of the lens layer Lens integrated with the second filter layer CF2 is 2 μm-2.5 μm. The thickness of the third lens layer Lens3 is 1.5 μm-2 μm, that is to say, the height of the protrusion of the lens layer Lens integrated with the third filter layer CF3 is 1.5 μm-2 μm.

The thickness h1 of the first lens layer Lens1 is greater than the thickness h2 of the second lens layer Lens2, and the thickness of the second lens layer Lens2 is greater than the thickness h3 of the third lens layer Lens3.

In the embodiment, although the thicknesses of the aforementioned three lens layers Lens overlap in the value range (2 μm and 2.5 μm), it does not mean that the thickness is the same, but only limits the possibility of its value, the premise is to meet the relationship between the magnitude of the three. For example, the thickness of the first lens layer Lens1 may be 2.5 μm, the thickness of the second lens layer Lens2 may be 2 μm, and the thickness of the third lens layer Lens3 may be 1.5 μm.

Figure 6:
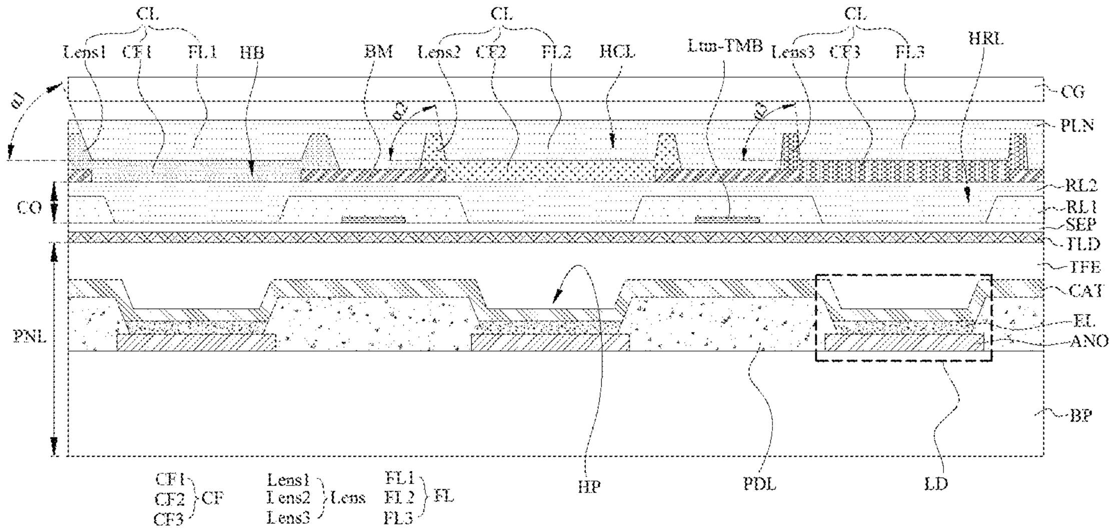
FIG. 6 is a schematic cross-sectional view of a third embodiment of the second type of embodiment of the display panel of the present disclosure.

As shown in FIG. 6, in the third embodiment, the difference in light extraction efficiency can be compensated by differentiated configuration of the slope angles of the side walls of the first light transmission hole HCL corresponding to the filter layers CF with different refractive indices. Specifically, in the two filter structures CL where the two filter layers CF with different refractive indices are located, the slope angle of the side wall of the first light transmission hole HCL corresponding to the filter layer CF with larger refractive index is smaller than the slope angle of the side wall of the first light transmission hole HCL corresponding to the filter layer CF with smaller refractive index. The larger the refractive index of the filter layer CF is, the gentler the sidewall of the corresponding first light transmission hole HCL is. Since the sidewall of the first light transmission hole HCL expands in the direction away from the display substrate PNL, the gentler sidewall is, the larger the incident angle of the light emitted by the light-emitting device LD and irradiated to the side wall is, and the easier it is to achieve the total reflection angle, and the better the light-converging effect is, thereby improving the light extraction efficiency. In this way, it is possible to realize the differentiation of the light-converging effect, and make the degree of improvement of the light-extraction efficiency consistent, thereby improving the uniformity of the brightness of the display panel.

For example, the slope angle of the sidewall of the first light transmission hole HCL of the first lens layer Lens1 may be 45°-50°. The slope angle of the sidewall of the first light transmission hole HCL of the second lens layer Lens2 may be 50°-55°. The slope angle of the sidewall of the first light transmission hole HCL of the third lens layer Lens3 may be 55°-60°. The slope angle α1 of the side wall of the first light transmission hole HCL of the first lens layer Lens1 is smaller than the slope angle α2 of the side wall of the first light transmission hole HCL of the second lens layer Lens2. The slope angle α2 of the sidewall of the first light transmission hole HCL of the second lens layer Lens2 is smaller than the slope angle α3 of the sidewall of the first light transmission hole HCL of the third lens layer Lens3.

Although the slope angles of the aforementioned three kinds of first light-transmitting holes HCL have overlapping points in the value range (50° and 55°), it does not mean that the slope angle can be the same, but only limits the possibility of its value, provided that the magnitude relationship between the three is satisfied. For example, the slope angle of the side wall of the first light transmission hole HCL of the first lens layer Lens1 may be 45°; then the slope angle of the side wall of the first light transmission hole HCL of the second lens layer Lens2 may be 50°; and the slope angle of the sidewall of the first light transmission hole HCL of the third lens layer Lens3 may be 55°.

As shown in FIG. 7, in the fourth embodiment, the difference in light extraction efficiency can also be compensated by differentiated configuration of the refractive index of the filling layer FL corresponding to the filter layers CF with different refractive indices. Specifically, in the two filter structures CL where the two filter lavers CF with different refractive indices are located, the refractive index of the filling layer FL of the filter structure CL to which the filter layer CF with a larger refractive index belongs is greater than the refractive index of the filling layer FL of the filter structure CL to which the filter layer CF with a smaller index belongs. Under the condition that the refractive index of the lens layer Lens is constant, the larger the refractive index of the filling layer FL is, the smaller the total reflection angle at which total reflection occurs at the side wall of the first light transmission hole HCL where it is located is, and the easier it is for total reflection to occur. Therefore, by increasing the refractive index of the filling layer FL in the lens layer Lens with a larger refractive index correspondingly, the total reflection angle can be reduced, so that more light emitted by the light-emitting device LD can be totally reflected, thereby improving the light-converging effect, and finally the light-extraction efficiency is improved, so that the light-converging effect can be differentiated, and the degree of improvement of the light-extraction efficiency can be consistent, thereby improving the uniformity of the brightness of the display panel.

For example, the refractive index of the first filling layer FL1 may be 1.83-1.87, such as 1.85. The refractive index of the second filling layer FL2 may be 1.73-1.77, such as 1.75. The refractive index of the third filling layer FL3 may be 1.68-1.72, such as 1.7. The refractive index of the first filling layer FL1 is greater than that of the second filling layer F2, and the refractive index of the second filling layer F2 is greater than that of the third filling layer F3.

Further, as shown in FIG. 7, in order to simplify the process, the planarizing layer PLN and one kind of filling layer FL can have the same refractive index, and adopt an integrated structure, so that they can be formed at the same time. For example: the planarizing layer PLN and the second filling layer FL2 can be formed in an integral structure, that is, the refractive index of the planarizing layer PLN may be the same as that of the second filling layer FL2.

Before forming the respective filling layer FL, the first light transmission hole HCL can be formed in the lens layer Lens first, and then the first filling layer FL1 and the third filling layer FL3 can be formed in the first light transmission holes HCL corresponding to the first filter layer CF1 and the third filter layer CF3. Then, the planarizing layer PLN covering the first filling layer FL1 and the third filling layer FL3 is formed, and the part of the planarizing layer PLN in the first light transmission hole HCL corresponding to the second filter layer CF2 is the second filling layer FL2.

In addition, in other embodiments of the present disclosure, any two or three of the schemes for improving brightness uniformity in the above-mentioned second to fourth embodiments can be combined to further increase the difference in light-converging effects, thereby improving the uniformity of brightness. For example:

In some embodiments, in the two filter structures CL in which the two filter layers CF with different refractive indexes are located, the thickness of the lens layer Lens of the structure CL to which the filter layer CF with the larger refractive index among the lens layers Lens with different refractive indexes belongs may be configured to be greater than the thickness of the lens layer Lens of the structure CL to which the filter layer CF with the smaller refractive index belongs. At the same time, the slope angle of the side wall of the first light transmission hole HCL of the filter structure CL to which the filter layer CF with a larger refractive index belongs may also be configured to be smaller than the slope angle of the side wall of the first light transmission hole HCL of the filter structure CL to which the filter layer CF with a smaller refractive index belongs.

Figure 8:
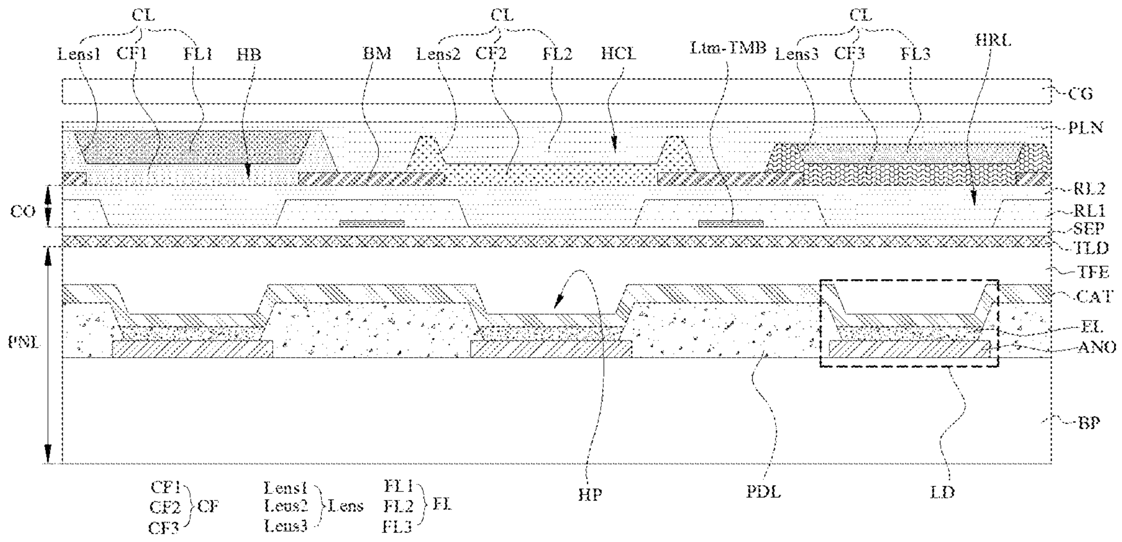
FIG. 8 is a schematic cross-sectional view of a fifth embodiment of the second type of embodiment of the display panel of the present disclosure.

As shown in FIG. 8, in some embodiments, in the two filter structures CL where the two filter layers CF with different refractive indices are located, the thickness of the lens layer Lens of the structure CL to which the filter layer CF with the larger refractive index among the lens layers Lens with different refractive indexes belongs may be configured to be greater than the thickness of the lens layer Lens of the structure CL to which the filter layer CF with the smaller refractive index belongs. At the same time, the refractive index of the filling layer FL of the filter structure CL to which the filter layer CF with a relatively large refractive index belongs can may also be configured to be higher than the refractive index of the filling layer FL of the filter structure CL to which the filter layer CF with a smaller refractive index belongs.

In some embodiments, in the two filter structures CL where the two filter layers CF with different refractive indices are located, the slope angle of the sidewall of the first light transmission hole HCL of the filter structure CL to which the filter layer CF with a larger refractive index belongs may be configured to be smaller than the slope angle of the sidewall of the first light transmission hole HCL of the filter structure CL to which the filter layer CF with a smaller refractive index belongs. At the same time, the refractive index of the filling layer FL of the filter structure CL to which the filter layer CF with a relatively large refractive index belongs can may also be configured to be higher than the refractive index of the filling layer FL of the filter structure CL to which the filter layer CF with a smaller refractive index belongs.

Figure 9:
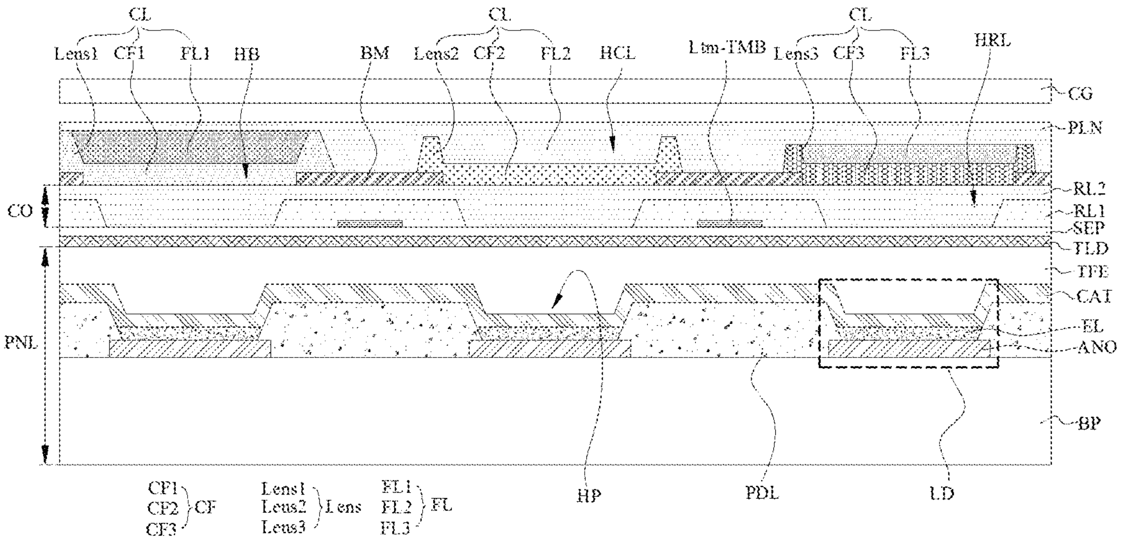
FIG. 9 is a schematic cross-sectional view of a sixth embodiment of the second type of embodiment of the display panel of the present disclosure.

As shown in FIG. 9, in some embodiments, in the two filter structures CL where the two filter layers CF with different refractive indices are located, the thickness of the lens layer Lens of the structure CL to which the filter layer CF with the larger refractive index among the lens layers Lens with different refractive indexes belongs may be configured to be greater than the thickness of the lens layer Lens of the structure CL to which the filter layer CF with the smaller refractive index belongs. At the same time, the slope angle of the side wall of the first light transmission hole HCL of the filter structure CL to which the filter layer CF with a larger refractive index belongs may also be configured to be smaller than the slope angle of the side wall of the first light transmission hole HCL of the filter structure CL to which the filter layer CF with a smaller refractive index belongs. In addition, the refractive index of the filling layer FL of the filter structure CL to which the filter layer CF with a relatively large refractive index belongs is higher than the refractive index of the filling layer FL of the filter structure CL to which the filter layer CF with a smaller refractive index belongs.

As shown in FIG. 1, the cover plate CG can be disposed on the side of the filter structure CL away from the display substrate PNL, and its material can be transparent materials such as glass or acrylic, and the film layer covered by the cover plate CG can be protected. The light emitted by the light-emitting device LD can finally exit from the interface between the cover plate CG and the air after being filtered by the light structure CL, that is, the light is exited from the surface of the cover plate CG away from the display substrate PNL. With the filter structure CL of the present disclosure, the light total reflected at the interface can be reduced.

Further, as shown in FIG. 2-FIG. 9, in order to increase the light extraction efficiency, a light concentrating layer CO can be provided between the display substrate PNL and the filter structure CL, and the light concentrating layer CO can converge at least part of the light emitted by the light-emitting device LD and irradiate to the first light transmission hole HCL of the corresponding filter structure CL, thereby enhancing the light concentrating effect.

As shown in FIGS. 2-9, in some embodiments of the present disclosure, the light concentrating layer CO can also use total reflection to achieve light concentration. Specifically, the light concentrating layer CO can include a first refraction layer RL1 and a second refraction layer RL2.

The first refraction layer RL1 may be disposed on the light-emitting side of the display substrate PNL. For example, the first refraction layer RL1 may be disposed on the side of the encapsulation layer TFE away from the driving backplane BP, and the first refraction layer RL1 can have a plurality of second transparent holes HRL, one second light transmission hole HRL corresponds to one light-emitting device LD and one first light transmission hole HCL, so as to form a channel for the light emitted by the light-emitting device LD to exit.

As shown in FIG. 12, for a light-emitting device LD and its corresponding first light transmission hole HCL and second light transmission hole HRL, the orthographic projection of the opening HP defining the light-emitting device LD on the drive backplane BP can be configured to be located within the orthographic projection of the second light transmission hole HRL on the driving backplane BP, and the orthographic projection of the second light transmission hole HRL on the driving backplane BP is located within the orthographic projection of the first light transmission hole HCL on the driving backplane B, that is, the boundaries of the corresponding opening HP, the second light transmission hole HRL and the first light transmission hole HCL may increase in a direction away from the driving backplane BP. Of course, the boundaries of the three can also be aligned, as long as the lens layer Lens and the first refraction layer RL1 do not block the opening HP.

At the same time, the sidewall of the second light transmission hole HRL may expand in the direction away from the display substrate PNL. The form of the sidewall of the second light transmission hole HRL may be the same as the first light transmission hole HCL, which may be enclosed by multiple planes, or by one or more curved surfaces. For example, an opening HP and its corresponding sidewalls of the first light transmission hole HCL and the second light transmission hole HRL are enclosed by N planes, and N may be a positive integer such as 4, 5, or 6.

The second refraction layer RL2 can cover the first refraction layer RL1 and fill the second light transmission hole HRL. The second refraction layer RL2 can play the role of planarization, that is, the surface of the second refraction layer RL2 away from the display substrate PNL is a plane, and its material can be the same as that of the planarizing layer PLN. The above filter layer CF and light absorbing layer BM can be disposed on the surface of the second refraction layer RL2 away from the display substrate PNL.

The refractive index of the second refraction layer RL2 is greater than that of the first refraction layer RL1, so that part of the light emitted by the light-emitting device LD is totally reflected at the side wall of the second light transmission hole HRL, and the reflected light can exit through the first light transmission hole HCL. For the light entering the first light transmission hole HCL without being totally reflected at the side wall of the second light transmission hole HRL, it can be totally reflected on the side wall of the first light transmission hole HCL. In this way, the light emitted by the light-emitting device LD can be totally reflected through the side walls of the second light transmission hole HRL and the first light transmission hole HCL to achieve light concentration and improve light extraction efficiency.

For example, the first refraction layer RL1 can be made of transparent materials such as optically clear adhesive (OCA), and its refractive index can be 1.45-1.5. The second refraction layer RL2 can be made of transparent materials such as optically clear adhesive (OCA), and its refractive index can be 1.7-1.75. In addition, for the filter structure CL in which the lens layer Lens and the filter layer CF use different materials, the lens layer Lens can also use transparent materials such as optically clear adhesive (OCA), and its refractive index can be 1.5. The material of the filling layer FL and the planarizing layer PLN may be the same as the second refraction layer RL2, and the refractive index can also be 1.7-1.75.

In other embodiments of the present disclosure, the light concentrating layer CO may also include a plurality of convex lenses capable of concentrating light, each convex lens may correspond to a light-emitting device LD, and light concentrating may be realized through the convex lenses.

In addition, in the display panel of the present disclosure, the number of light-concentrating layers CO can be multiple, and they are stacked along the direction away from the display substrate PNL, and the filter structure CL can be provided on the light-concentrating layer CO that is farthest from the display substrate PNL.

It is verified by experiments that, on the basis of the first type of implementation, the light output gain of a display panel combined with one layer of the above-mentioned light-concentrating layer CO can reach 37.2%. On the basis of the first implementation of the second type of implementation, the light output gain of a display panel combined with one layer of the above-mentioned light-concentrating layer CO can reach 35.5%.

In addition, as shown in FIG. 3-FIG. 7 and FIG. 10 and FIG. 11, in some embodiments of the present disclosure, the display panel further includes a touch layer, which can be disposed on the light-emitting side of the display substrate PNL. For example, the touch layer can be disposed on the side of the encapsulation layer TFE away from the driving backplane BP, and is used for sensing touch operation.

The touch layer may include a touch electrode layer TMB, the first refraction layer RL1 may cover the touch electrode layer TMB, and the first refraction layer RL1 may be used to protect the touch electrodes, avoiding setting a special protective layer in the touch layer. Of course, in some embodiments of the present disclosure, a protective layer covering the touch electrode layer TMB may also be provided, and the first refraction layer RL1 is provided on the surface of the protective layer away from the display substrate PNL. At the same time, in order to improve the light transmittance and reduce the shielding of the light-emitting device LD by the touch electrode layer TMB, the touch electrode layer TMB can be a mesh structure connected by a plurality of channel lines Ltm, and the mesh structure has a plurality of mesh holes TH. One light-emitting device LD may correspond to one mesh hole TH, that is, the orthographic projection of a light-emitting device LD on the driving backplane BP is located within the orthographic projection of a mesh hole TH on the driving backplane BP. In some embodiments of the present disclosure, one mesh hole TH may correspond to only one light-emitting device LD, and the shape of the mesh hole TH may be the same as that of the light-emitting device LD. Certainly, in other embodiments of the present disclosure, one mesh hole TH may also correspond to a plurality of light-emitting devices LD.

As shown in FIGS. 3 to 7, the width of the channel line Ltm is smaller than the distance between two adjacent second light transmission holes HRL, so that the orthographic projection of the channel line Ltm on the display substrate PNL is located within the orthographic projection of the light-absorbing layer BM on the display substrate PNL, thereby avoiding the channel line Ltm from blocking the light-emitting device LD.

Figure 10:
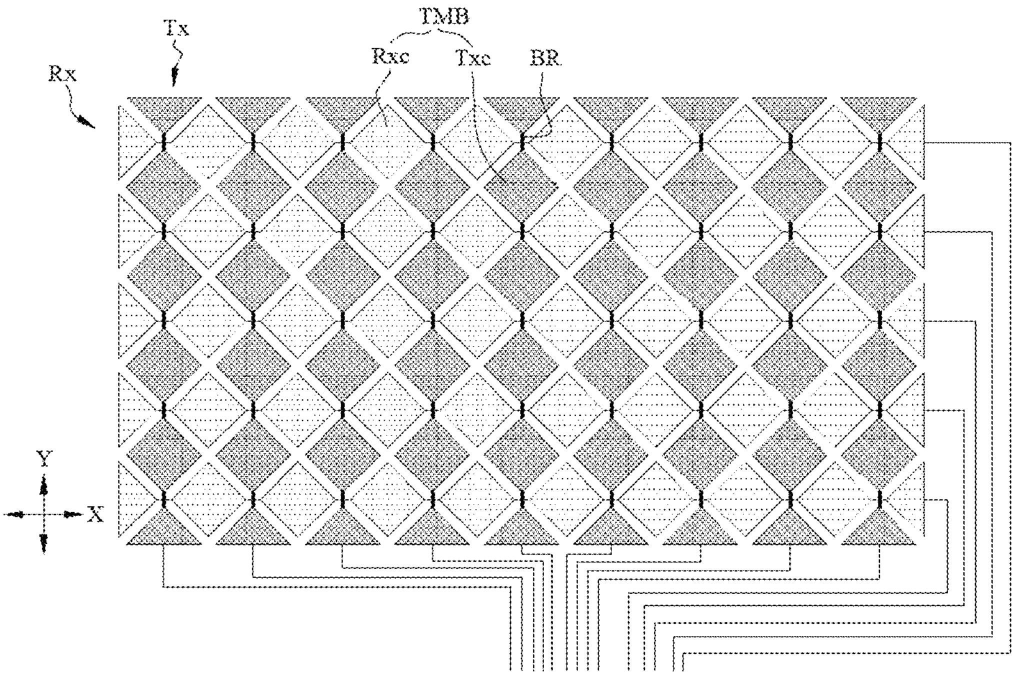
FIG. 10 is a schematic top view of the touch layer in an embodiment of the display panel of the present disclosure.

Taking the touch layer TPS adopting a mutual capacitive touch structure as an example, as shown in FIG. 10, the touch layer may include a plurality of first touch electrodes Tx and a plurality of second touch electrodes Rx, and the respective first touch electrodes Tx may be distributed along the row direction X at intervals, and a first touch electrode Tx may include a plurality of first electrode blocks Txc distributed along the column direction Y at intervals and a bridge BR connecting two adjacent first electrode blocks Txc; and the respective second touch electrodes Rx can be distributed along the column direction Y at intervals, a second touch electrode Rx includes a plurality of second electrode blocks Rxc connected in series along the row direction X. One bridge BR is configured to intersect and insulated from one second touch electrode Rx. One of the first touch electrode Tx and the second touch electrode Rx can be used as a transmitting electrode, and the other can be used as a receiving electrode.

Figure 11:
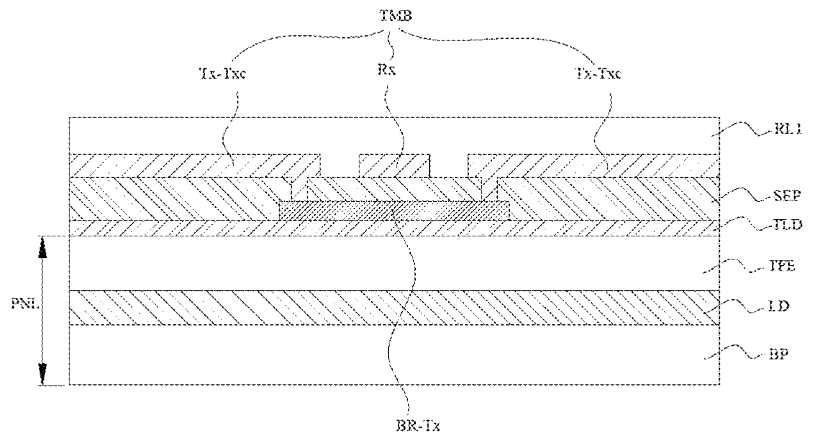
FIG. 11 is a schematic partial cross-sectional view of an embodiment of the display panel of the present disclosure.

As shown in FIG. 11, the above-mentioned first electrode block Txc and second touch electrode Rx are both located on the touch electrode layer TMB, that is, the first electrode block Txc and the second touch electrode Rx are arranged on the same layer, so that they can be form simultaneously with the same process. The bridge BR can be located in a bridging layer, which can be located between the touch electrode layer TMB and the encapsulation layer TFE. In addition, the touch layer may also include a buffer layer TLD and an isolation layer SEP.

As shown in FIGS. 3-7, the buffer layer TLD can be disposed on the surface of the encapsulation layer TFE away from the driving backplane BP, and its material can be insulating materials such as silicon nitride and silicon oxide, which are not specifically limited here. The bridging layer can be disposed on the surface of the buffer layer TLD away from the driving backplane BP, and include a plurality of bridges BR distributed in an array. The bridging layer can be made of metal or other conductive materials.

The isolation layer SEP can cover the bridging layer, and the material of the isolation layer SEP can be insulating materials such as silicon nitride and silicon oxide, which are not specifically limited here. The touch electrode layer TMB can be disposed on the surface of the isolation layer SEP away from the driving backplane BP, and include the first electrode block Txc and the second touch electrode Rx mentioned above. The first refraction layer RL1 may cover the touch electrode layer TMB and the isolation layer SEP not covered by the touch electrode layer TMB. Meanwhile, since the first refraction layer RL1 has the second light transmission hole HRL, the second refraction layer RL2 located in the second light transmission hole HRL may be in contact with the isolation layer SEP.

In addition, the touch layer can also adopt a self-capacitive touch structure. The touch electrode layer TMB can include a plurality of electrode blocks distributed in an array, and each electrode block can be connected to the peripheral touch drive circuit through an independent wiring. The specific structure will not be described in detail here.

The present disclosure also provides a display device, and the display device may include the display panel in any of the foregoing implementation manners. The display panel is a display panel in any of the above-mentioned implementation manners, and its specific structure and beneficial effects can refer to the above-mentioned implementation manners of the display panel, which will not be repeated here. The display device of the present disclosure may be an electronic device with a display function such as a mobile phone, a tablet computer, and a television, and will not be listed here.

Other implementations of the present disclosure will be readily apparent to those skilled in the art from consideration of the specification and practice of the invention disclosed herein. This application is intended to cover any modification, use or adaptation of the present disclosure, and these modifications, uses or adaptations follow the general principles of the present disclosure and include common knowledge or conventional technical means in the technical field not disclosed in the present disclosure. The specification and examples are to be considered exemplary only, with the true scope and spirit of the disclosure indicated by the appended claims.

What is claimed is:

1. A display panel, comprising:

a display substrate, comprising a plurality of light-emitting devices distributed in an array;

a plurality of filter structures, disposed on a light-emitting side of the display substrate, one of the light-emitting devices corresponds to one of the filter structures; at least a part of the filter structures comprise a filter layer, a lens layer and a filling layer, the lens layer is disposed on the side of the filter layer away from the display substrate, the lens layer is provided with a first light transmission hole exposing at least part of the filter layer, a side wall of the first light transmission hole is expended along a direction away from the display substrate; the filling layer is filled in the first light transmission hole and laminated on a surface of the filter layer away from the display substrate, a refractive index of the filling layer is greater than the refractive index of the lens layer where the light transmission hole filled by the filling layer is located; and a cover plate, disposed on a side of the filter structures away from the display substrate, wherein the display panel further comprises:

a light concentrating layer, disposed between the display substrate and the filter structure, and is configured to converge at least part of light emitted by the light-emitting device to the first light transmission hole of the corresponding filter structure.

2. The display panel according to claim 1, wherein materials of the lens layer and the filter layer of a same filter structure are different.

3. The display panel according to claim 2, wherein respective lens layers are connected into an integral structure.

4. The display panel according to claim 1, wherein the lens layer and the filter layer of a same filter structure are integrally structured.

5. The display panel according to claim 4, wherein the filter layer of respective filter structures comprises at least two filter layers of different colors; and the filter layers of different colors have different refractive indices; and in two filter structures in which two filter layers with different refractive indexes are located, a thickness of the lens layer of the filter structure to which the filter layer with a larger refractive index belongs is greater than the thickness of the lens layer of the filter structure to which the filter layer with a smaller refractive index belongs.

6. The display panel according to claim 5, wherein the filter layer comprises a first filter layer, a second filter layer and a third filter layer with different colors, the refractive index of the first filter layer is greater than the refractive index of the second filter layer, and the refractive index of the second filter layer is greater than the refractive index of the third filter layer;

the thickness of the lens layer of the filter structure to which the first filter layer belongs is 2.5 μm-3 μm;

the thickness of the lens layer of the filter structure to which the second filter layer belongs is 2 μm-2.5 μm; and the thickness of the lens layer of the filter structure to which the third filter layer belongs is 1.5 μm-2 μm.

7. The display panel according to claim 4, wherein the filter layer of respective filter structures comprises at least two filter layers of different colors; the filter layers of different colors have different refractive indices;

in two filter structures in which two filter layers with different refractive indexes are located, a slope angle of the sidewall of the first light transmission hole of the filter structure to which the filter layer with a larger refractive index belongs is smaller than the slope angle of the sidewall of the first light transmission hole of the filter structure to which the filter layer with a smaller refractive index belongs.

8. The display panel according to claim 7, wherein the filter layer comprises a first filter layer, a second filter layer and a third filter layer with different colors, the refractive index of the first filter layer is greater than the refractive index of the second filter layer, and the refractive index of the second filter layer is greater than the refractive index of the third filter layer;

the slope angle of the sidewall of the first light transmission hole of the filter structure to which the first filter layer belongs is 45°-50°;

the slope angle of the sidewall of the first light transmission hole of the filter structure to which the second filter layer belongs is 50°-55°; and the slope angle of the sidewall of the first light transmission hole of the filter structure to which the third filter layer belongs is 55°-60°.

9. The display panel according to claim 4, wherein the filter layer of respective filter structures comprises at least two filter layers of different colors; and the filter layers of different colors have different refractive indices; and in two filter structures in which two filter layers with different refractive indexes are located, the refractive index of the filling layer of the filter structure to which the filter layer with a larger refractive index belongs is greater than the refractive index of the filling layer of the filter structure to which the filter layer with a smaller refractive index belongs.

10. The display panel according to claim 9, wherein the filter layer comprises a first filter layer, a second filter layer and a third filter layer with different colors, the refractive index of the first filter layer is greater than the refractive index of the second filter layer, and the refractive index of the second filter layer is greater than the refractive index of the third filter layer;

the refractive index of the filling layer of the filter structure to which the first filter layer belongs is 1.83-1.87;

the refractive index of the filling layer of the filter structure to which the second filter layer belongs is 1.73-1.77; and the refractive index of the filling layer of the filter structure to which the third filter layer belongs is 1.68-1.72.

11. The display panel according to claim 1, wherein the display panel further comprises:

a planarizing layer, covering respective filter structures, and the refractive index of the planarizing layer is not less than the refractive index of the filling layer.

12. The display panel according to claim 11, wherein the planarizing layer is integrally structured with at least one filling layer.

13. The display panel according to claim 1, wherein the display panel further comprises:

a light-absorbing layer, disposed on a same surface as the filter layer, and having a plurality of through holes, one of the through holes corresponds to one of the light-emitting devices; and at least a part of one filter layer is located in one of the through holes.

14. The display panel according to claim 1, wherein the light concentrating layer comprises:

a first refraction layer, disposed on the light-emitting side of the display substrate and comprising a plurality of second light transmission holes, one of the second light transmission holes corresponds to one of the light-emitting devices and one of the first light transmission holes, a sidewall of the second light transmission hole is expanded in a direction away from the display substrate; and a second refraction layer, configured to cover the first refraction layer and fill the second light transmission hole; the refractive index of the second refraction layer is greater than the refractive index of the first refraction layer.

15. The display panel according to claim 14, wherein the display panel further comprises a driving backplane and a pixel definition layer, the pixel definition layer and the light-emitting device are disposed on a same side of the driving backplane, and the pixel definition layer is provided with an opening defining a range of each of the light-emitting devices;

in one opening and the first light transmission hole and second light transmission hole corresponding to the opening, an orthographic projection of the opening on the driving backplane is located within the orthographic projection of the second light transmission hole on the driving backplane, and the orthographic projection of the second light transmission hole on the driving backplane is located within the orthographic projection of the first light transmission hole on the driving backplane.

16. The display panel according to claim 14, wherein the display panel further comprises:

a touch electrode layer, disposed on the light-emitting side of the display substrate, wherein the first refractive layer covers the touch electrode layer; the touch electrode layer is a mesh structure having a plurality of mesh holes connected by a plurality of channel lines; at least one of the light-emitting devices corresponds to one of the mesh holes; and a width of the channel line is smaller than a distance between two adjacent second light transmission holes.

17. A display device, comprising a display panel, wherein the display panel comprises:

a display substrate, comprising a plurality of light-emitting devices distributed in an array;

a plurality of filter structures, disposed on a light-emitting side of the display substrate, one of the light-emitting devices corresponds to one of the filter structures; at least a part of the filter structures comprise a filter layer, a lens layer and a filling layer, the lens layer is disposed on the side of the filter layer away from the display substrate, the lens layer is provided with a first light transmission hole exposing at least part of the filter layer, a side wall of the first light transmission hole is expended along a direction away from the display substrate; the filling layer is filled in the first light transmission hole and laminated on a surface of the filter layer away from the display substrate, a refractive index of the filling layer is greater than the refractive index of the lens layer where the light transmission hole filled by the filling layer is located; and a cover plate, disposed on a side of the filter structures away from the display substrate, wherein the display panel further comprises:

a light concentrating layer, disposed between the display substrate and the filter structure, and is configured to converge at least part of light emitted by the light-emitting device to the first light transmission hole of the corresponding filter structure.

18. The display device according to claim 17, wherein materials of the lens layer and the filter layer of a same filter structure are different.

19. The display device according to claim 18, wherein respective lens layers are connected into an integral structure.

* * * * *